(12) United States Patent
Mitsev et al.

(10) Patent No.: US 10,371,581 B2
(45) Date of Patent: Aug. 6, 2019

(54) ALUMINA DIFFUSION BARRIER FOR SENSING ELEMENTS

(71) Applicant: SENSATA TECHNOLOGIES, INC., Attleboro, MA (US)

(72) Inventors: Petar Mitsev, Sofia (BG); Radostina H. Tsoneva, Sofia (BG); Nikolay K. Nikolov, Sofia (BG); Benny Van Daele, Olen (BG); Peter Tilmans, Ghent (BG); Christiaan Baerts, Belgium (BG)

(73) Assignee: Sensata Technologies, Inc., Attleboro, MA (US)

( * ) Notice: Subject to any disclaimer, the term of this patent is extended or adjusted under 35 U.S.C. 154(b) by 219 days.

(21) Appl. No.: 15/612,583

(22) Filed: Jun. 2, 2017

(65) Prior Publication Data

US 2018/0348062 A1 Dec. 6, 2018

(51) Int. Cl.
*G01K 1/10* (2006.01)
*G01K 7/18* (2006.01)
(Continued)

(52) U.S. Cl.
CPC .............. *G01K 1/10* (2013.01); *C23C 14/221* (2013.01); *C23C 16/483* (2013.01); *G01K 1/12* (2013.01);
(Continued)

(58) Field of Classification Search
CPC ............... G01K 1/10; G01K 1/12; G01K 1/18
(Continued)

(56) References Cited

U.S. PATENT DOCUMENTS 4,324,761 A * 4/1982 Harris .................... G01N 27/12
324/71.5
4,892,850 A 1/1990 Hori
(Continued)

FOREIGN PATENT DOCUMENTS

CN 105716735 A 6/2016
JP 2014001116 A 1/2014

OTHER PUBLICATIONS

"Kathy Sahner", "Automotive Exhaust Gas Sensing Current Trends", The 14th International Meeting on Chemical Sensors, 2012/2.1.4, pp. 161-163.
(Continued)

*Primary Examiner* — Kyung S Lee
(74) *Attorney, Agent, or Firm* — George N. Chaclas; Burns & Levinson, LLP

(57) ABSTRACT

A sensing element for a temperature sensor including a base with a platinum meander applied thereto. An alumina diffusion barrier (ADB) covers the meander to provide protection against contamination and structural stabilization, wherein the alumina diffusion barrier is a contiguous polycrystalline layer fabricated from alumina and approximately 1% by weight of a rutile additive to be substantially devoid of network porosity. The contiguous polycrystalline layer includes grains with a typical grain size being in a range of 0.5-3 μm. A method for fabricating an alumina diffusion barrier includes the steps of: combining a nano-alumina and nano-rutile powder to create a formulation; applying the formulation to the platinum meander to form a layer; and sintering the layer to create a contiguous polycrystalline layer covering the platinum meander.

15 Claims, 10 Drawing Sheets
(1 of 10 Drawing Sheet(s) Filed in Color)

(51) Int. Cl.
  *G01K 7/16* (2006.01)
  *G01K 1/12* (2006.01)
  *C23C 16/48* (2006.01)
  *C23C 14/22* (2006.01)
  *G01M 15/10* (2006.01)

(52) U.S. Cl.
  CPC .............. *G01K 7/16* (2013.01); *G01K 7/18* (2013.01); *G01K 2205/04* (2013.01); *G01M 15/102* (2013.01)

(58) Field of Classification Search
  USPC .......................................................... 338/228
  See application file for complete search history.

(56) References Cited

U.S. PATENT DOCUMENTS

| | | | |
|---|---|---|---|
| 5,831,512 | A | 11/1998 | Wienand et al. |
| 6,301,887 | B1 | 10/2001 | Gorel et al. |
| 6,353,381 | B1 | 3/2002 | Dietmann et al. |
| 6,437,681 | B1 | 8/2002 | Wang et al. |
| 6,617,956 | B1 | 9/2003 | Zitzmann |
| 8,333,506 | B2 | 12/2012 | Kamenov et al. |
| 9,028,142 | B2 * | 5/2015 | Raravikar ............. B82Y 15/00 374/183 |
| 9,073,011 | B2 | 7/2015 | Hatfield |
| 2002/0084885 | A1 * | 7/2002 | Wienand ................ G01K 7/183 338/25 |
| 2005/0224360 | A1 * | 10/2005 | Varghese ............... B82Y 30/00 205/171 |
| 2007/0049484 | A1 * | 3/2007 | Kear ..................... B82Y 30/00 501/103 |
| 2010/0147684 | A1 * | 6/2010 | Park ..................... G01N 27/127 204/431 |
| 2014/0311221 | A1 * | 10/2014 | Gole ..................... G01N 27/127 73/31.06 |
| 2015/0131702 | A1 | 5/2015 | O'Sullivan et al. |
| 2018/0348062 | A1 * | 12/2018 | Mitsev ..................... G01K 1/10 |

OTHER PUBLICATIONS

"Thomas Classen et al.", "Trends in Automotive Exhaust Gas Sensing", Sensor + Test Conferences 2011 Sensor Proceedings, D3.1, pp. 554-556.
"Stefan Carstens", "Exhaust Gas Temperature Sensors", DieselNet Technology Guide Sensors for Engine and Emission Control, www.dieselnet.com/tech/sensors_temperature.php, Jan. 17, 2017, 3 pages.
"What you need to know about exhaust gas temperature sensors and oil level sensors", "www.fpsdistribtution.com", Apr. 27, 2016, 5 pages.
"Wikipedia", "Exhaust gas temperature gauge", "www.wikipedia.org/w/index.php?title=Exhaust_gas_temperature_gauge&oldid=746053596", Jan. 17, 2017, 2 pages.
"Wikipedia", "Rutile", "https://en.wikipedia.org/w/index.php?title=Rutile&oldid=747750303", Jan. 18, 2017, 4 pages.
"Wikipedia", "Oxygen Sensor" Wikipedia, "https://en.wikipedia.org/w/index.php?title=Oxygen_sensor&oldid=757189670", Jan. 17, 2017, 10 pages.
Xue, et al., "Low-Temperature Sintering of Alumina with Liquid Forming Additives," J. Am. Ceram. Soc., vol. 74, No. 8, pp. 2011-2013, 1991.
Erkalfa, et al., "Densification of Alumina at 1250° C. with MnO2 and TiO2 Additives," Ceramics International, vol. 21, pp. 345-348, 1995.
Erkalfa, et al., "The Effect of TiO2 and MnO2 on Densification and Microstructural Development of Alumina," Ceramics International, vol. 24, pp. 81-90, 1998.
Search Report from related Great Britain Application No. GB1808771.8 dated Nov. 30, 2018 (4 pages).

* cited by examiner

ALUMINA DIFFUSION BARRIER FOR SENSING ELEMENTS

BACKGROUND OF THE INVENTION

1. Field of the Invention

The subject disclosure relates to sensing elements subject to high thermal shock and/or chemically aggressive environments, and more particularly to temperature sensing elements for automotive exhaust gas measurement applications.

2. Background of the Related Art

Emission regulations are an important source for driving innovation in the development of cleaner running engines. The automotive industry has made many advances in engine design, engine controls, fuel injection and the like in order to improve emissions. The exhaust system has been of particular importance in meeting and exceeding regulations. In order to insure proper function of the exhaust system and engine overall, various sensors provide information to the engine controls. Typical sensors include temperature sensors, pressure sensors and oxygen sensors (also known as lambda sensors).

The exhaust system is a particularly difficult environment in which to deploy sensors. Typical operating temperatures range from the very cold ambient temperature at start up to 750-1000° C. during operation in hot points of the exhaust. The thermal shocks may be as much as 1100 $Ks^{-1}$ measured by a 0.75 mm thermocouple. Further, the exhaust system often has caustic gases that can be quite corrosive. Along with these rapid temperature changes and chemically hostile environment, significant vibration is not unusual. As a result, sensor life is often limited and failure can occur. Moreover, the stability of sensors is affected by the thermal soak and thermoshock. This so-called drift gives the sensor reading an offset, usually a positive offset, with respect to the nominal response.

There are many types of temperature sensors. For example, U.S. Pat. No. 5,831,512 ('512 patent), issued on Nov. 3, 1998 to Wienard et al., discloses a resistance thermometer. The '512 patent uses a platinum meander or wire in a serpentine pattern to determine the temperature. A ceramic platelet is applied to the platinum meander for protection. U.S. Pat. No. 8,333,506, issued on Dec. 18, 2012 to Kamenov et al., discloses a conformal coating to protect the assembly. U.S. Pat. No. 6,617,956, issued on Sep. 9, 2003 to Zitzmann, discloses a protective intermediate layer with a protective glaze applied thereto. U.S. Pat. No. 6,353,381, issued on Mar. 5, 2002 to Dietmann et al., discloses a resistance layer with a diffusion barrier as an intermediate layer and a passivation layer to protect the resistance layer against atmospheric poisoning from the surroundings.

SUMMARY OF THE INVENTION

In view of the above, a need exists for a sensing element that is robust enough to withstand large temperature swings and high thermal shock.

One embodiment of the subject technology is a sensing element for a temperature sensor comprising: a base or substrate that may be alumina ($Al_2O_3$) or magnesium titanite ($MgTiO_3$); a platinum trace or meander applied to the substrate; lead wires with chip pads electrically connected to the Pt meander; an alumina diffusion barrier (ADB) covering the Pt meander to provide protection against contamination and structural stabilization, wherein the alumina diffusion barrier is a contiguous polycrystalline layer fabricated from alumina and approximately 1% by weight of a rutile or anatase additive to be substantially devoid of network porosity. The sensing element can further comprise: a glass layer applied onto the ADB; a second alumina diffusion barrier applied to the glass layer; a second glass layer applied to the second alumina diffusion barrier; a cover plate applied to the second glass layer; fixing glass applied to the cover plate; and a case enclosing the base, the platinum trace, the lead wires, the glass layers, the alumina diffusion barriers, the cover plate, and the fixing glass. The rutile and/or anatase additive may be a highly reactive form of nano-$TiO_2$.

Another embodiment of the subject technology is a method for fabricating an alumina diffusion barrier for a temperature sensing element having a platinum meander, the method comprising the steps of: combining a nano-alumina and nano-rutile powder to create a formulation; applying the formulation to the platinum meander to form a layer; and sintering the layer to create a contiguous polycrystalline layer covering the platinum meander. The nano-alumina powder and nano-rutile susbstantially preferably consist of particles typically less than 150 nm in size. In other words, the B50 of the powder is typically less than or equal to 150 nm. The method can also further comprise the step of combining at least one of a sintering promoter, minor fritted glass, and magnesium oxide (MgO) with the formulation. A ratio of rutile to magnesium oxide may be 2:1. The formulation can be prepared by a high shear rate planetary ball mill process and/or applied using a deposition process. In one embodiment, the layer is approximately 35 μm thick. The sintering is typically between 1250-1350° C.

Still another embodiment of the subject technology is a diffusion barrier for a sensing element having a platinum meander, the diffusion barrier consisting of: a contiguous polycrystalline layer fabricated from alumina and approximately 1% by weight of a rutile additive to be substantially devoid of network porosity. The contiguous polycrystalline layer can include grains with a typical grain size being in a range of 0.5-3 μm. Typically, the contiguous polycrystalline layer is at least 2 μm thick.

It should be appreciated that the subject technology can be implemented and utilized in numerous ways, including without limitation as a process, an apparatus, a system, a device, a method for applications now known and later developed. These and other unique features of the system disclosed herein will become more readily apparent from the following description and the accompanying drawings.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

So that those having ordinary skill in the art to which the disclosed technology appertains will more readily understand how to make and use the same, reference may be had to the following drawings.

DETAILED DESCRIPTION OF PREFERRED EMBODIMENTS

Figure 1:
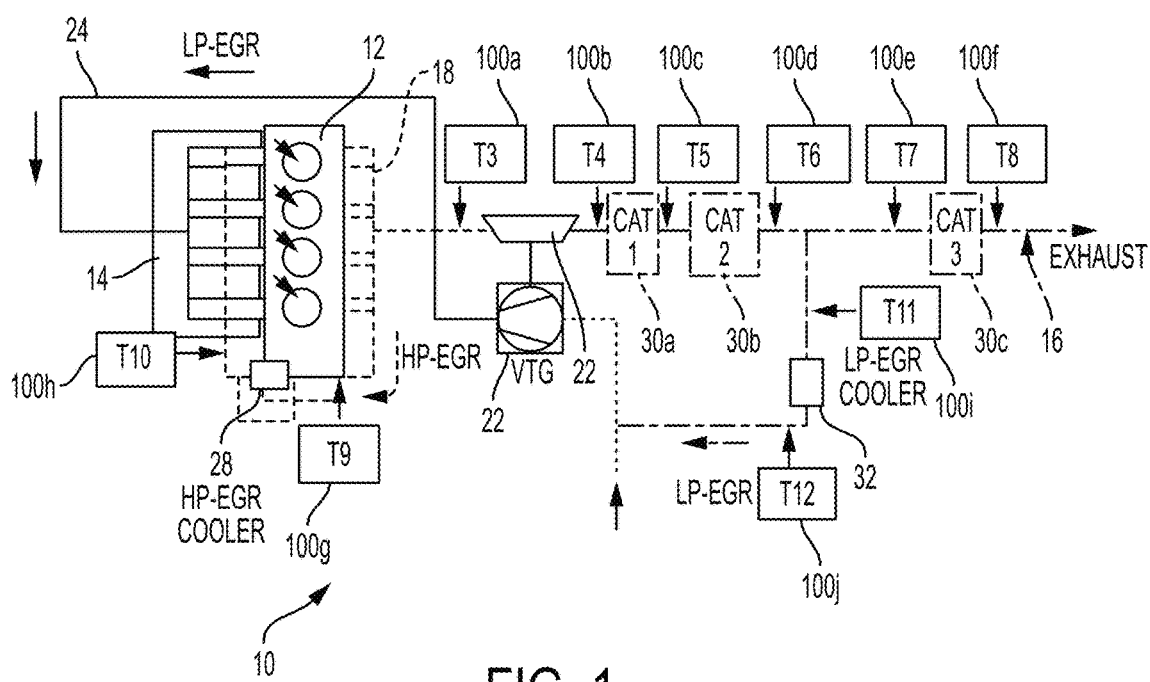
FIG. 1 is a schematic view of an engine system in accordance with the subject technology.

The subject technology overcomes many of the prior art problems associated with sensor assemblies and, particularly improves the robustness of the sensing element. The advantages, and other features of the technology disclosed herein, will become more readily apparent to those having ordinary skill in the art from the following detailed description of certain preferred embodiments taken in conjunction with the drawings which set forth representative embodiments of the present technology and wherein like reference numerals identify similar structural elements. Directional indications such as upward, downward, right, left and the like are used with respect to the figures and not meant in a limiting manner.

Briefly, the subject technology has broad applicability to any engine application but has particular applicability to the most challenging and hottest applications. Although the example below is with respect to exhaust gas recirculation (EGR), it is just one of many possible application as would be understood by those of ordinary skill in the art.

Referring to FIG. 1, a schematic view of an engine system 10 with exhaust gas recirculation is shown. EGR has become a well-known approach to lower exhaust emissions (e.g., gases from the tailpipe). EGR recirculates a portion of the gases coming out of the engine 12 by putting the exhaust emissions back into the intake manifold 14, where the engine 12 can burn the emissions again, thereby reducing the emissions. EGR is a particularly effective strategy to control NOx emissions from diesel engines. EGR reduces NOx through lowering the oxygen concentration in the combustion chamber, as well as through heat absorption.

The exhaust system 16 has many components including piping and fittings shown in a simplified manner in FIG. 1. The exhaust system 16 collects hot engine emissions from the exhaust manifold 18 for subsequent processing. The exhaust system 16 selectively routes the emissions to a variable turbine geometry (VTG) 22. The VTG 22 has air intake to feed a low pressure EGR section 24. There is also a high pressure EGR cooler 28 in a high pressure EGR section 26 that feeds the intake manifold 14. The EGR cooler 28 uses engine coolant to reduce exhaust gas temperatures prior to recirculating them through the engine's intake manifold 14. Reducing engine combustion temperature helps prevent the formation of Oxides of Nitrogen (NOx) pollutants.

However, much of the emissions still exits the exhaust system 16. Before egress, the emissions pass through three catalytic converters 30a-c. The catalytic converters 30a-c may be any type and number such as an oxidation catalytic converter (DOC), particulate oxide purification (POC), diesel particulate filter (DPF), NOC, NSC, SCRF, SCR, NST, DOC-DPF, NH3 and the like for oxidizing the exhaust gas and removing exhaust soot particles to reduce harmful gas emissions. Preferably, there is also a second low pressure EGR cooler 32 for additionally feeding air to the VTG 22.

The engine control system (not shown) interacts with these components and monitors various parameters using a plurality of sensors. The following description relates to temperature sensors but it is understood that the subject technology is applicable to any type of sensor including, without limitation, pressure sensors, combination temperature and pressure sensors, and oxygen sensors. The exhaust system 16 has a plurality of temperature sensors 100a-j, which may or may not be interchangeable. Additionally, the engine system 10 may be an existing engine system that has temperature sensors in accordance with the subject technology retrofit therein.

Figure 2:
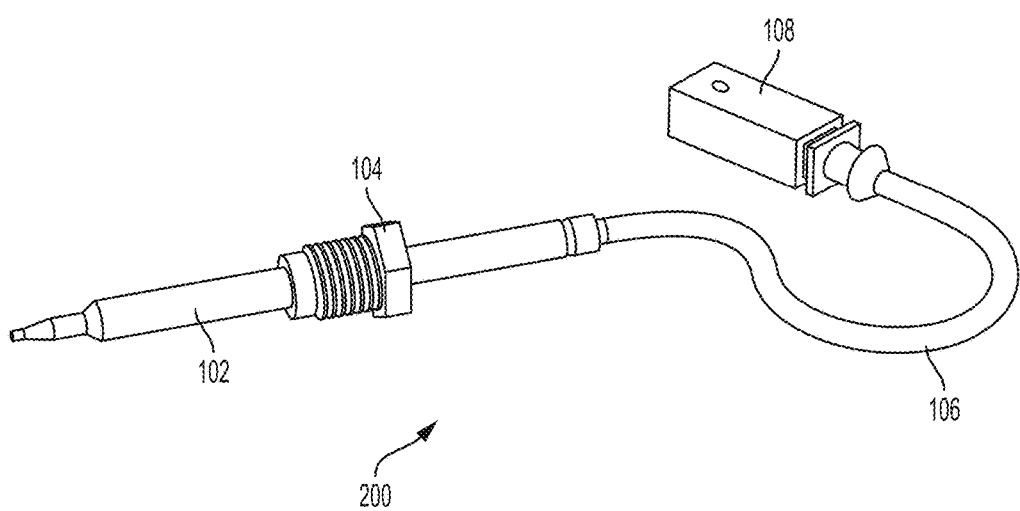
FIG. 2 is a perspective view of a sensor assembly in accordance with the subject technology.

Referring now to FIG. 2, a perspective view of a sensor assembly 100 in accordance with the subject technology are shown. The sensor assembly 100 has a shield/housing assembly 102 with a portion 104 for connecting to the exhaust system 16 or other location as desired. A cable 106 extends from the shield/housing assembly 102 and terminates in an electrical connector 108. Typically, the electrical connector 108 would have two pins (not shown).

Figure 3:
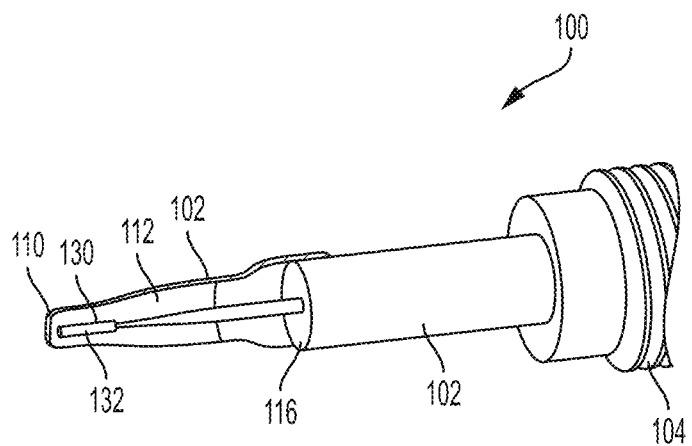
FIG. 3 is a partial cross-sectional view of the sensor assembly of FIG. 2.
Figure 4:
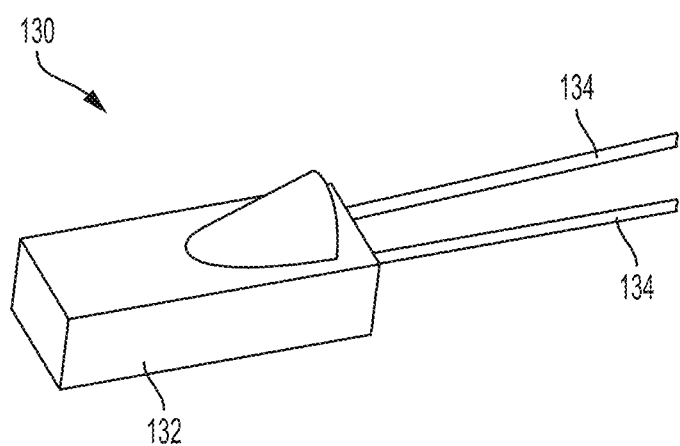
FIG. 4 is a perspective view of the sensing element of the sensor assembly of FIG. 2.

A partial cross-sectional view of a distal portion 110 of the sensor assembly 100 is shown in FIG. 3. The distal portion 110 of the housing 102 encloses a sensing element 130, shown in isolated perspective view in FIG. 4. The sensing element 130 has a case 132 with leads 134 extending therefrom. The leads 134 may extend all the way to the proximal electrical connector 108 or couple to wires for additional length. The distal portion 110 is filled with insulation material 112. Preferably, the connection portion 104 is threaded to facilitate a sealed engagement in the exhaust system 16.

Figure 5A:
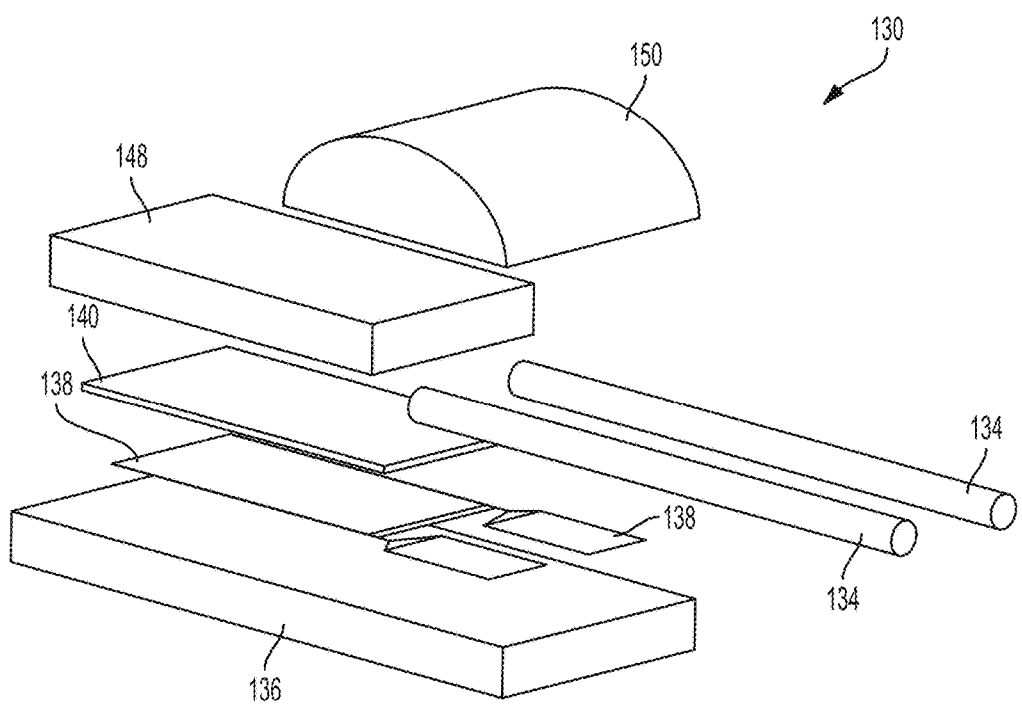
FIG. 5A is an exploded view of the sensing element of the sensor assembly of FIG. 2.
Figure 5B:
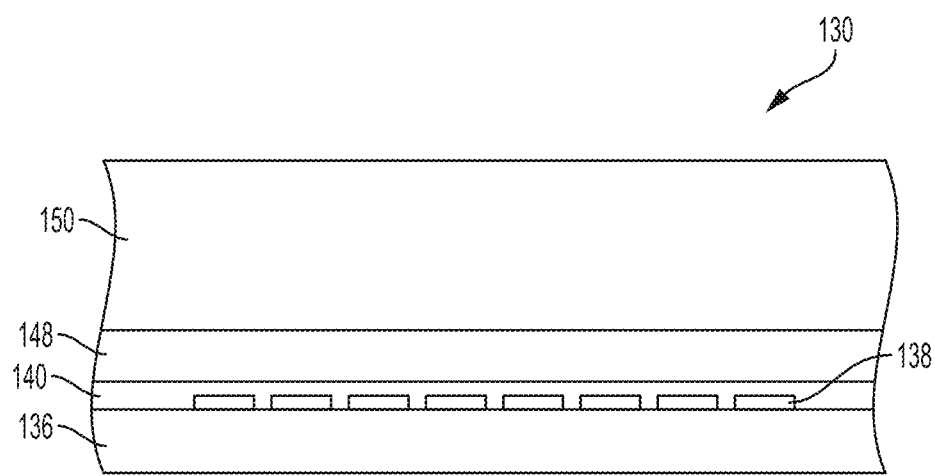
FIG. 5B is a cross-sectional view of the sensing element of the sensor assembly of FIG. 2.

Referring now to FIGS. 5A and 5B, exploded and cross-sectional views of the sensing element 130 of the sensor assembly 100 are shown. The sensing element 130 has a base or substrate 136 that may be alumina ($Al_2O_3$) or magnesium titanite ($MgTiO_3$). A platinum trace or meander 138 is applied to the substrate 136 by sputtering, vapor deposition or printing. The Pt meander 138 may have a variety of shapes and sizes but a serpentine pattern is preferred. In one embodiment, chip pads (not shown) electrically connect the Pt meander 138 to the lead wires 134.

Since the Pt meander 138 is relatively sensitive and catalytically active, protection is needed. An alumina diffusion barrier (ADB) 140 covers the Pt meander 138 to provide protection against contamination and structural stabilization. A cover plate 148 is applied to the ADB 140. Fixing glass 150 is then applied to the cover plate 148 with the entire stack being enclosed in the case 132 (see FIG. 4). In another embodiment, additional glass layers, alumina barriers and the like may be applied.

Figure 6:
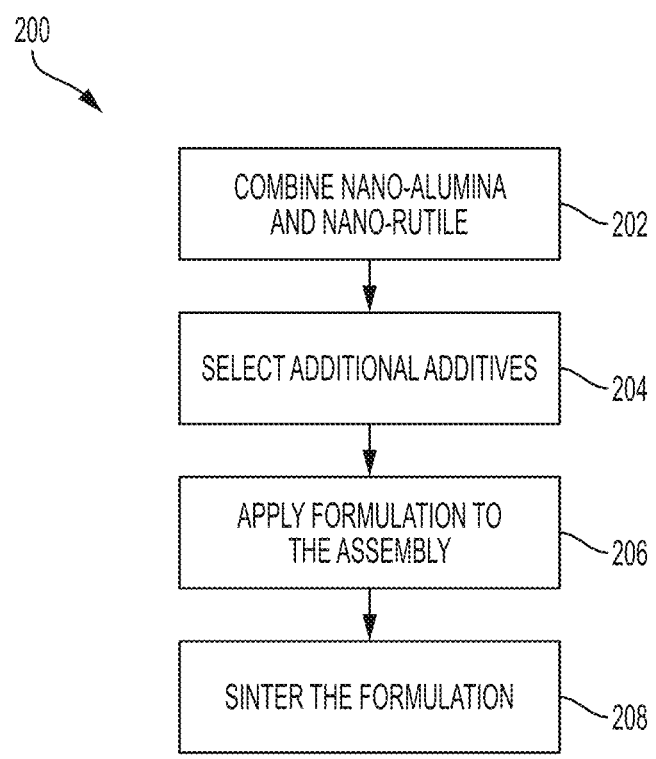
FIG. 6 is a flowchart of a method for fabricating an alumina diffusion barrier in accordance with the subject technology.

Referring now to FIG. 6, a flowchart 200 of a method for fabricating an alumina diffusion barrier in accordance with the subject technology is shown. In one embodiment, the ADB is a thick-film screen-printable paste formulation including a high-purity nano-alumina powder plus 1% by weight of a rutile additive. Typical film thickness is 35 μm with a tolerance of 5 μm. Preferably, the rutile or anatase additive is a highly reactive form of nano-$TiO_2$. Nano-alumina powder and nano-rutile substantially consist of particles typically less than 150 nm in size. In one embodiment, the nano-alumina powder and nano-rutile substantially consist of particles typically less than 50 nm in size. The rutile additive promotes sintering at temperature substantially below that of pure nano-alumina. As a result, the ADB is a high-thermodynamic-performance ceramics-rich composite.

At step 202, the nano-alumina and nano-rutile powder are combined. For example, the nano-alumina and nano-rutile powder are mixed to form a paste.

At step 204, additional additives may be added as desired depending upon the application. Additional additives may include sintering promoters, minor flitted glass, magnesium oxide (MgO), magnesium titanite ($MgTiO_3$) and the like. In one embodiment, the ratio of rutile to magnesium oxide is 2:1. The formulation may be a dielectric paste with good colloid dispersion and wetting. Preferably, the formulation is prepared by a high shear rate planetary ball mill process.

At step 206, the desired formulation is applied to the platinum meander, glass layer or other location as desired. Preferably, the formulation is applied using a deposition process such as pulsed laser deposition or ion beam assisted deposition. The formulation may also be applied by screen printing. In one embodiment, the deposited layer(s) is 35 μm thick. It is envisioned that the layer can be any thickness such as less than 1 μm thick or thicker than 50 μm. Typically, the layer is 7-35 μm thick. By reducing the thickness, the stresses exerted over the sensing element, and particularly the sensitive platinum meander, are minimized.

At step 208, the applied formulation is sintered to create a contiguous polycrystalline layer. In one embodiment, the sintering is between 1250-1350° C. In another embodiment, the layer is sintered at 1050° C. Typical particle size is 400 nm to 1 μm.

Figure 7:
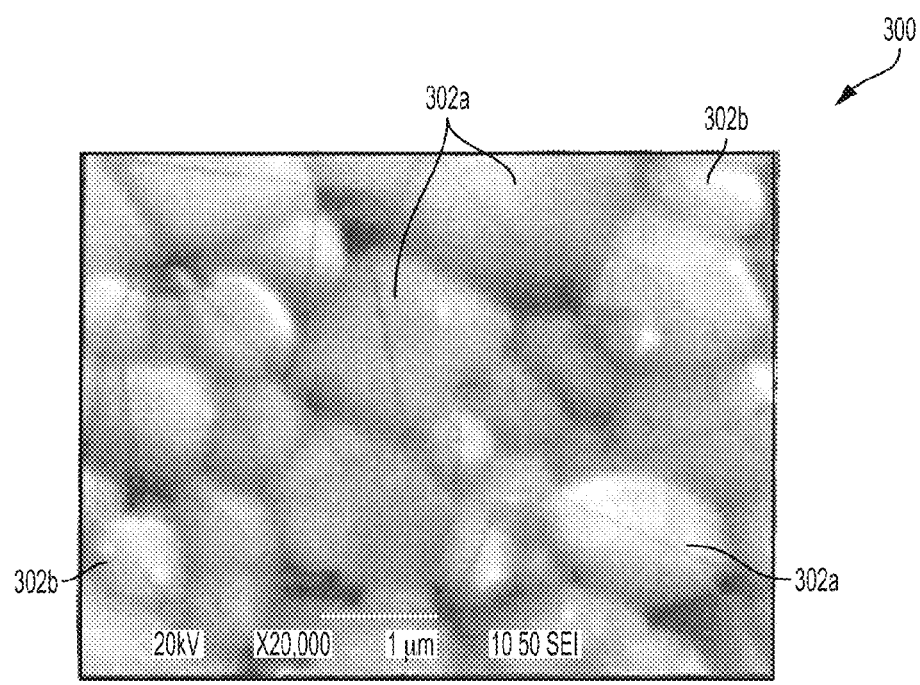
FIG. 7 is a scanning electron microscope photograph of an alumina diffusion barrier in accordance with the subject technology.

Referring now to FIG. 7, a scanning electron microscope (SEM) photograph 300 of an ADB in accordance with the subject technology is shown. The photograph 300 is of a contiguous polycrystalline layer that is devoid or substantially devoid of network porosity. The adhesion and cohesion are significantly increased compared to prior art protective layers. Thus, the ADB of FIG. 7 yields an improved diffusion barrier and structural stability and, in turn, improved stability of the sensing element.

The ADB of FIG. 7 has some grain with typical grain size being in the 0.5-3 μm range. The grains 300a, 300b are fairly equally distributed between with some of the larger grains 300a being more than 3 μm and many of the smaller grains 300b being less than 1 μm in size. The grains 300a, 300b are densely packed so that even very thin layers have limited porosity if any.

Figure 8:
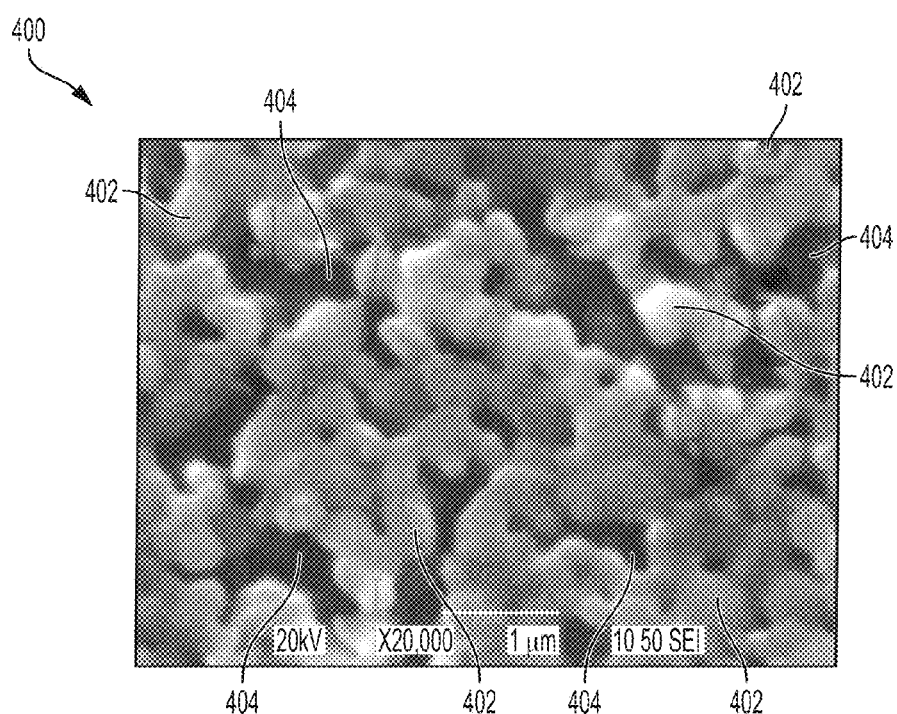
FIG. 8 is a scanning electron microscope photograph of a prior art alumina diffusion barrier.

FIG. 8 is a scanning electron microscope photograph 400 of a prior art alumina diffusion barrier. The prior art diffusion barrier may be alumina, glass and other oxide approaches. Grains 402 in the photograph are typically smaller than 1 μm, much smaller and so loosely packed that significant porosity is created. In other words, significant openings 404 through the barrier layer are present. As a result, an underlying platinum meander would be subject to contamination, which causes drift of the sensing element.

Figure 9:
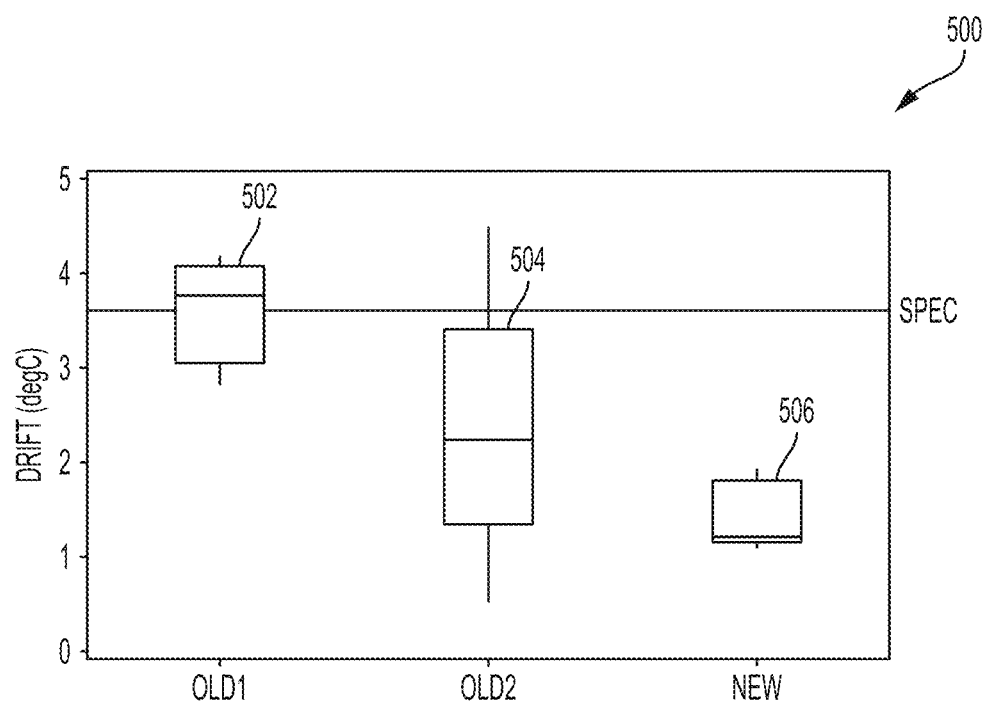
FIG. 9 is a graph of the drift of various temperature sensors.

Referring now to FIG. 9, a graph 500 of the drift of various temperature sensors is shown. To collect the data, a drift test at 400° C. was conducted after aging the test devices for 120 hours at 900° C. The vertical axis is temperature drift in degrees centigrade. Drift is an expression of stability representing how much a sensing element deviates from an original reading, typically after a certain amount of time. A first prior art sensing element has about 3-4° C. of drift as shown by the first notation 502. A second prior art sensing element has about 1.5 to over 3.3° C. of drift as shown by the second notation 504. In contrast, a sensing element in accordance with the subject technology has less than 2° C. to maximum of about 1.75° C. of drift as shown by the third notation 506. Such an improvement demonstrates how the subject technology is a significant advancement. For example, if the specification is a drift below 3.7° C., then the subject technology would be well within the specification. The specification may depends on the specific application and requirements.

Figure 10:
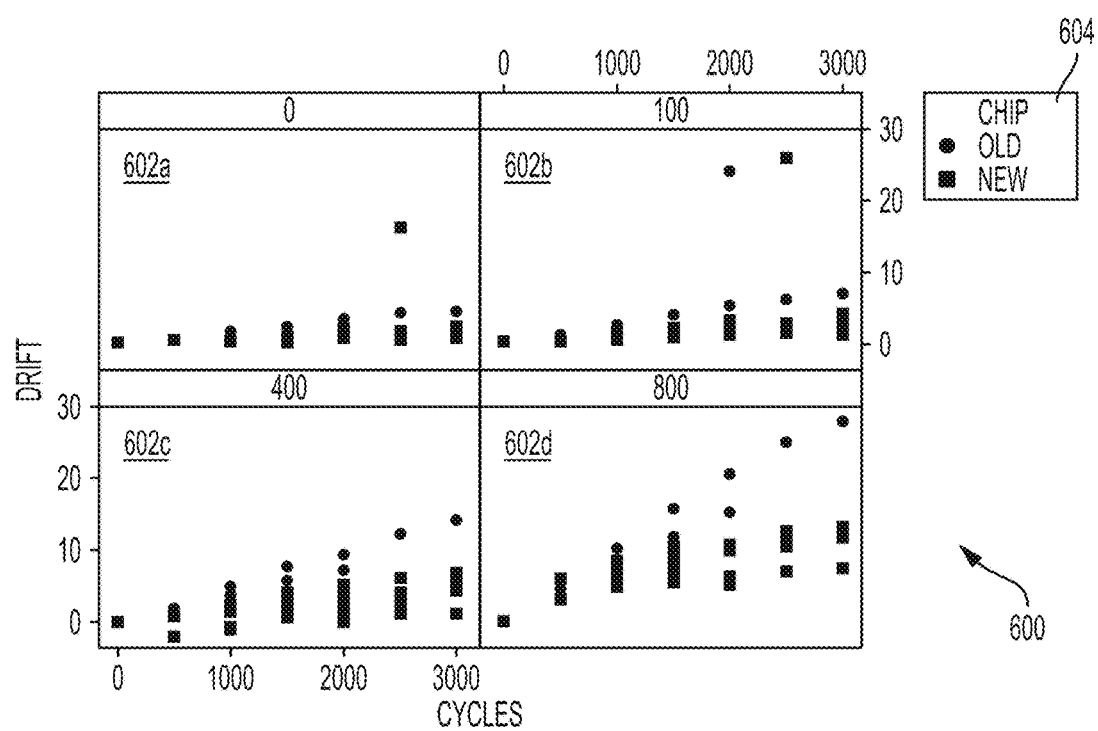
FIG. 10 is a graph of the dynamic robustness of various temperature sensors at various test temperatures.

Referring now to FIG. 10, a graph 600 of the dynamic robustness of various temperature sensors is shown. The graph 600 plots unity drift (vertical axis in degrees C.) versus a number of cycles (horizontal axis) in four panes 602a-d. In pane 602a, the data relates to a test temperature of 0° C. Panes 602b-d have data relating to test temperatures of 100, 400, and 800° C., respectively. Dynamic robustness is expressed in unity drift. The dynamic in FIG. 10 is the type of aging test, namely thermo-mechanical cycling. The drift is measured at several temperatures as function of the cycles in the thermo-mechanical cycle test. The drift is lower for the new group having an alumina diffusion barrier in accordance with the subject technology as compared to a reference group. A legend 604 illustrates how the new group data points are denoted by squares as compared to the reference or old group, which are denoted by circles.

Additional sensor data was acquired using a high temperature ageing test. This test included 24 hour aging with thermal soaking combined with an applied electrical field of 5 volts. Sensors in accordance with the subject technology improved by an order of magnitude compared to reference prior art sensors.

In another embodiment, the ADB has a combination of sintering promoters supplemented by minor fitted glass, magnesium oxide (MgO). Other constituents may also be added such as titanium dioxide ($TiO_2$). A preferred ratio of titanium dioxide to magnesium oxide is 2:1.

Figure 11:
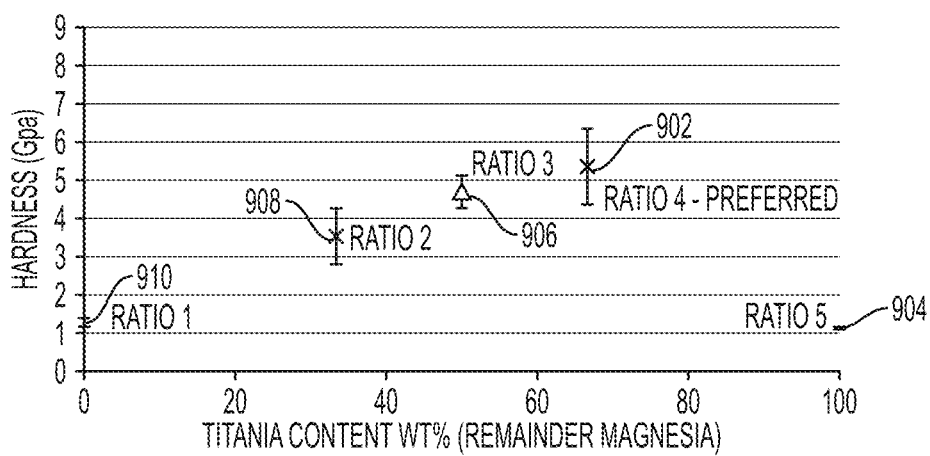
FIG. 11 is a graph of hardness for various sintering promoters in various quantities is shown.

Referring now to FIG. 11, a graph 900 of hardness for various sintering promoters in various quantities is shown. Hardness is on the vertical axis against titania content on the horizontal axis. Five different formulations were tried of varying the ratio of titanium dioxide to magnesium oxide. As noted above, a 2:1 ratio of titanium dioxide to magnesium oxide is preferred as denoted by mark 902 on the graph 900. Additional marks 902, 904, 906, 908 are shown for the other four formulations.

It is envisioned that temperature sensors in accordance with the subject technology can be retrofit into any existing system as well as designed into new systems. Other sensor designs can also benefit from the teachings herein. For example, a single alumina diffusion barrier may be all that is needed. Further, although the subject technology has been described with respect to the field of temperature sensors, it is envisioned that the subject technology would be equally applicable to other fields and applications such as on any kind of sensor including pressure sensors.

It will be appreciated by those of ordinary skill in the pertinent art that the functions of several elements may, in alternative embodiments, be carried out by fewer elements, or a single element. Similarly, in some embodiments, any functional element may perform fewer, or different, operations than those described with respect to the illustrated embodiment. Also, functional elements (e.g., layers, housings, casings, plates and the like) shown as distinct for purposes of illustration may be incorporated within other functional elements in a particular implementation.

All patents, patent applications and other references disclosed herein are hereby expressly incorporated in their entireties by reference. While the subject technology has been described with respect to preferred embodiments, those skilled in the art will readily appreciate that various changes and/or modifications can be made to the subject technology without departing from the spirit or scope of the invention as defined by the appended claims. For example, each claim may depend from any or all claims in a multiple dependent manner even though such has not been originally claimed.

What is claimed is:

1. A sensing element for a temperature sensor comprising:
   a substrate;
   a platinum trace or meander applied to the substrate;
   lead wires with chip pads electrically connected to the Pt meander;
   an alumina diffusion barrier (ADB) covering the Pt meander to provide protection against contamination and structural stabilization, wherein the alumina diffusion barrier is a contiguous polycrystalline layer fabricated from alumina and approximately 1% by weight of a rutile additive to be substantially devoid of network porosity.

2. A sensing element as recited in claim 1, further comprising:
   a glass layer applied onto the ADB;
   a second alumina diffusion barrier applied to the glass layer;
   a second glass layer applied to the second alumina diffusion barrier;
   a cover plate applied to the second glass layer;
   fixing glass applied to the cover plate; and
   a case enclosing the base, the platinum trace, the lead wires, the glass layers, the alumina diffusion barriers, the cover plate, and the fixing glass.

3. A sensing element as recited in claim 1, wherein the rutile or anatase additive is a highly reactive form of nano-$TiO_2$.

4. A method for fabricating an alumina diffusion barrier for a temperature sensing element having a platinum meander on a substrate, the method comprising the steps of:
   combining a nano-alumina and nano-rutile powder to create a formulation;
   applying the formulation to the platinum meander to form a layer; and
   sintering the layer to create a contiguous polycrystalline layer covering the platinum meander on the substrate.

5. A method as recited in claim 4, wherein the nano-alumina powder and nano-rutile substantially consist of particles typically less than 150 nm in size.

6. A method as recited in claim 4, further comprising the step of combining at least one of a sintering promoter, minor fritted glass, and magnesium oxide (MgO) with the formulation.

7. A method as recited in claim 4, wherein a ratio of rutile to magnesium oxide is 2:1.

8. A method as recited in claim 4, wherein the formulation is prepared by a high shear rate planetary ball mill process.

9. A method as recited in claim 4, wherein the formulation is applied using a deposition process.

10. A method as recited in claim 4, wherein the layer is approximately 2 μm thick.

11. A method as recited in claim 4, wherein the sintering is between 1250-1350° C.

12. A method as recited in claim 4, wherein the substrate is selected from the group consisting of alumina ($Al_2O_3$) and magnesium titanite ($MgTiO_3$).

13. A diffusion barrier for a sensing element having a platinum meander, the diffusion barrier consisting of:
   a contiguous polycrystalline layer fabricated from alumina and approximately 1% by weight of a rutile additive to be substantially devoid of network porosity.

14. A diffusion barrier as recited in claim 13, wherein the contiguous polycrystalline layer includes grains with a typical grain size being in a range of 0.5-3 μm.

15. A diffusion barrier as recited in claim 13, wherein the contiguous polycrystalline layer is at least 2 μm thick.

* * * * *